United States Patent [19]

Sawa

[11] Patent Number: 4,726,884
[45] Date of Patent: Feb. 23, 1988

[54] METHOD OF HIGH SPEED PLATING

[75] Inventor: Hironari Sawa, Mitaka, Japan

[73] Assignee: Surtech Company Limited, Tokyo, Japan

[21] Appl. No.: 17,947

[22] Filed: Feb. 24, 1987

[30] Foreign Application Priority Data

Feb. 21, 1986 [JP] Japan .................................. 61-34971

[51] Int. Cl.⁴ ................................................ C25D 5/00
[52] U.S. Cl. ...................................................... 204/24
[58] Field of Search ............................... 204/24, 26, 27

[56] References Cited

FOREIGN PATENT DOCUMENTS 56-3690  1/1981  Japan ..................................... 204/24

Primary Examiner—T. M. Tufariello
Attorney, Agent, or Firm—Sughrue, Mion, Zinn, Macpeak, and Seas

[57] ABSTRACT

Disclosed is a method of high-speed plating which comprises carrying out plating of a substrate, for example, a through-hole wiring substrate, which is under being parallelly rotated in a plane including the surface of the substrate simultaneously with being vibrated in up-and-down direction and/or in right and left direction at predetermined angle with the rotating direction.

6 Claims, 3 Drawing Figures

METHOD OF HIGH SPEED PLATING

BACKGROUND OF THE INVENTION AND RELATED ART

The present invention relates to a high-speed plating method, according to which high-speed plating of a substrate to be plated, especially a through-hole wiring substrate (referred to as "T.H.P." hereinafter) having many fine holes can be performed not only with a high throwing power plating bath of low metallic ion concentration and high acid concentration, but also with a plating bath of a medium metallic ion concentration at a high cathodic current density.

Hitherto, plating of T.H.P. has been carried out with a high throwing power bath with various additives at a cathodic current density of 1–3 Amp/dm$^2$. The purpose of use of the high throwing power bath and additives is to control electro-deposition on the surface of panel by the additives to prevent the ratio of the thickness (H) on hole portion by the thickness (S) on the surface from becoming small.

When high-speed plating is made on the surface of for example a chip carrier of IC and not on the materials of such shape as of T.H.P., this has been accomplished by applying a high-speed stream of a plating solution. However, such a conventional method of using the high-speed stream cannot be employed with plating baths other than that of high metallic ion concentration and low acid concentration of about pH 4 and cannot be applied to T.H.P. Thus, high-speed plating of T.H.P. has not been realized.

Furthermore, in the case of a plating bath of low metallic ion concentration and high acid concentration, since a high-speed stream thereof flow on metallic surface, a laminar flow occurs at the smooth surface and the layer which contacts with the surface does not flow, which makes it impossible to supply the metal ions. Furthermore, since the acid concentration is high, it sometimes occurs that the portion of the metal surface with which the stream continuously and directly collides is etched.

As a conspicuous example, when a stream from nozzle directly strikes against the material to be plated, the surface of the material opposite to the position of the nozzle is not plated and a linear visible scorch appears on the portion of the surface which corresponds to the center between nozzles.

SUMMARY OF THE INVENTION

The present invention relates to a high-speed plating method which is free from the above defects and which comprises carrying out plating of a substrate which is parallelly rotated in a plane including the surface of the substrate simultaneously with being vibrated at a predetermined rotation angle with the rotating direction in up-and-down (vertical) direction and/or right and left (bilatral) direction. According to this method, high-speed plating of the substrate can be performed not only with a high throwing power plating bath of a low metallic ion concentration and high acid concentration, but also with a plating bath of medium metallic ion concentration at a high cathodic current density.

DESCRIPTION OF THE INVENTION

According to the present invention, a substrate to be plated is applied with a movement at predetermined radius of gyration, rotation speed and rotation angle, whereby (1) inner wall of hole is uniformly and rapidly supplied with metallic ions and cathodic current due to turbulent flow caused by stress induced in the plating solution near the inner wall of hole and (2) supply of metallic ions to the surface of the substrate is secured since vibration in the direction rectangular with the substrate is generated between anodes due to the rotation angle and thus, it becomes possible to perform high-speed plating of inner wall of holes and surface of the substrate.

The method of the present invention will be explained in detail below with reference to the accompanying drawing.

Figure 1:
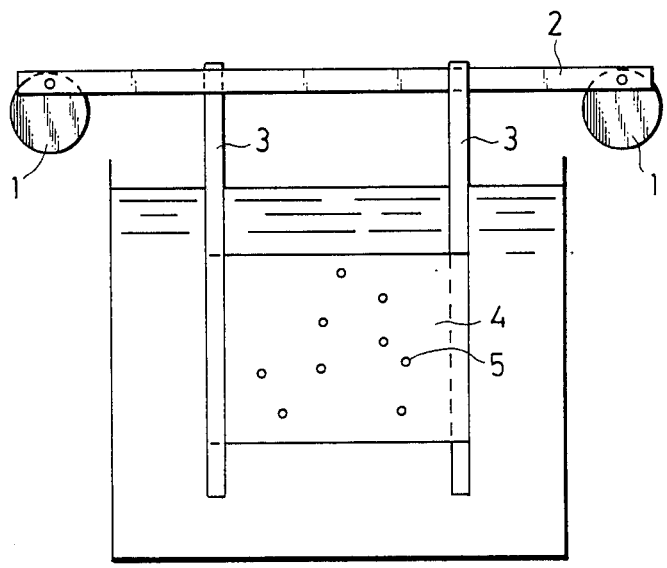
FIG. 1 is a schematic front view of one embodiment of a plating apparatus for practice of the present method.

FIG. 1 is a schematic front view of one plating apparatus for practice of the present method, wherein (1) indicates a pair of rotating discs which have a predetermined radium of gyrating and are rotated by a driving member (not shown) and both ends of busbar (2) are relatively fixed to the two rotating discs (1) at a position at a certain distance from the center of each disc.

A pair of hanging jigs (3) are suspended from busbar (2) as shown and a substrate to be plated, for example, T.H.P. (4) is held between these jigs.

The T.H.P. (4) held as mentioned above is dipped in a plating bath and the rotating discs (1) are rotated by a driving device, this rotation causes rotation of T.H.P. (4) through busbar (2) and hanging jigs (3) and thus, holes (5) provided on the surface of T.H.P. (4) are similarly rotated.

The method of the present invention is characterized in that plating is carried out by parallelly rotating a substrate to be plated, namely, T.H.P. (4) in a plane including the surface of T.H.P. simultaneously with vibrating it in right and left (bilateral) direction (FIG. 2) and/or in up and down (vertical) direction (FIG. 3) with providing certain angles ($\alpha,\beta$) with the rotating direction.

Figure 2:
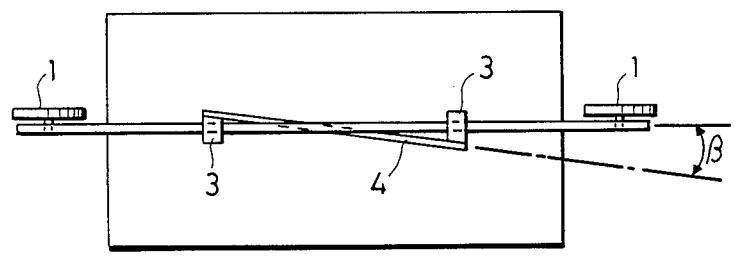
FIG. 2 is a schematic top plane view of the apparatus shown in FIG. 1

FIG. 2 is a schematic top plane view of the apparatus of FIG. 1, wherein hanging jigs (3) are suspended from busbar (2) so that T.H.P. (4) is inclined bilaterally by an angle of $\beta$ to busbar (2). Therefore, there is a amplitude at an right angle with the surface of T.H.P. (4) by a value of diameter of gyration x sin $\beta$ and frequency thereof equals to number of rotation.

Figure 3:
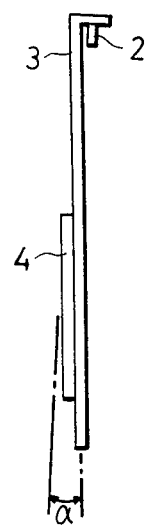
FIG. 3 is a schematic side view of the apparatus shown in FIG. 1.

FIG. 3 is a schematic side view of the plating apparatus of FIG. 1, wherein hanging jigs (3) are suspended from busbar (2) at an inclination of angle $\alpha$ to vertical direction and so T.H.P. (4) is inclined by an angle of $\alpha$ to vertical direction.

When the method of the present invention is worked using the above mentioned apparatus, metallic ions and cathodic current can be uniformly and rapidly supplied to inner wall of holes of T.H.P. by turbulence induced by stress formed in the plating solution near the holes and on the other hand, the supply of metallic ions to the surface of panel can be secured by turbulence of the plating bath caused by vibration which is generated at an right angle with the panel between anodes due to the rotating angle, whereby high-speed plating becomes possible.

The following examples further illustrate the present invention.

EXAMPLE 1

Plating of five substrates of $100 \times 100 \times 1.6$ mm and having 81 holes for 10 minutes was carried out in a plating bath comprising 180 g/l of copper sulfate and 200 g/l of sulfuric acid at 28° C. and at a rotating number of twice per second and a rotating angle ($\alpha$) of 1° with a diameter of hyration of rotating disc of 20 mm and at 6 Amp/dm$^2$.

As a result, copper plated substrate of 12.3 $\mu$ thick having the surface free of scorch were obtained.

In this Example, additives for copper sulfate bath were not used, but the ratio of deposit thickness on the wall of holes (H) and that on the surface (S), namely, H/S ratio was 66%.

EXAMPLE 2

Five substrates of $100 \times 100 \times 1.6$ mm and having 81 holes were plated in a plating bath comprising 180 g/l of copper sulfate and 200 g/l of sulfuric acid at 28° C. for 10 minutes and under the conditions of radium of rotation of rotating disc=20 mm; number of rotation=twice per second; angle of rotation ($\beta$)=1° and current density =8 Amp/dm$^2$.

As a result, copper plated substrates of 16 in thickness of deposit having surface free of scorch.

Although no additives for copper sulfate bath were added, the H/S ratio was 90%.

EXAMPLE 3

Twenty substrates of $330 \times 400 \times 1.6$ mm having about 2500 holes were plated in a plating bath containing 120 g/l of copper sulfate, 200 g/l of sulfuric acid and 20 g/l of copper sulfate bath additive CX-B manufactured by Harshaw Murata at 28° C. for 10 minutes under the conditions of radium of rotation of rotating disc =80 mm; number of rotation=twice per second; angle of rotation ($\alpha$)=1° and current density=12 Amp/dm$^2$.

As a result, beautiful copper plated substrates having a deposit thickness of about 25$\mu$ and a H/S of 75% were obtained.

EXAMPLE 4

Twenty substrates of $100 \times 200 \times 1.6$ mm having 2500 holes were plated in a soldering bath comprising 14 g/l of tin, 9 g/l of lead and 500 g/l of borofluoric acid at 28° C. for 3 minutes under the conditions of radium of rotation of rotating disc=40 mm, number of rotation=twice per second; angle of rotation ($\alpha$ and $\beta$)=1°, respectively and current density=15 Amp/dm$^2$.

As a result, beautiful soldered substrates having a deposit thickness of about 18$\mu$ and an H/S of about 100% were obtained.

EXAMPLE 5

Ten substrates of $100 \times 200 \times 1.6$ mm and having 100 holes were plated in a plating bath comprising 120 g/l of copper sulfate, 200 g/l of sulfuric acid and 20 g/l of additive CX-B at 28° C. for 10 minutes and under the conditions of radium of rotation of rotating disc=20 mm; number of rotation=twice per second; angle of rotation ($\alpha$)=1° and current density=16 Amp/dm$^2$.

As a result, beautiful copper plated substrates having a deposit thickness of about 32 and an H/S of 90% were obtained.

EXAMPLE 6

Ten substrates of $100 \times 200 \times 1.6$ mm having 100 holes were plated in a plating bath comprising 180 g/l of copper sulfate, 200 g/l of sulfuric acid and 20 g/l of additive CX-B at 28° C. for 8 minutes and under the conditions of radium of rotation of rotating disc=20 mm; number of rotation=twice per second; angle of rotation ($\beta$)=1° and current density=18 Amp/dm$^2$.

As a result, copper plated substrates having a deposit thickness of about 25$\mu$ and an H/S of 90% were obtained.

In the conventional methods, the cathodic current density is about 2 Amp/dm$^2$ and the H/S ratio is 10-20%. Furthermore, in the conventional methods where no additives are added, the H/S ratio is still 10-20% with a copper sulfate concentration of 180 g/l.

On the other hand, according to the method of the present invention, as shown in Examples 1 and 2, H/S ratio was 66% and 90% without additives. When additives were added, H/S ratios were 75-100% as shown in Examples 3-6.

According to the method of the present invention, high-speed plating can be attained not only with a high throwing power bath of low metallic ion concentration and high acid concentration, but also with a plating bath of a medium metallic ion concentration using a high cathodic current density.

What is claimed is:

1. A method of high-speed plating which comprises carrying out plating of a substrate which is parallelly rotated in a plane including the surface of the substrate simultaneously and being vibrated in an up-and-down direction and a right and left direction at predetermined angles with respect to the rotating direction.

2. A method according to claim 1 wherein the substrate is a through-hole wiring substrate.

3. A method of high-speed plating which comprises carrying out plating of a substrate which is parallelly rotated in a plane including the surface of the substrate simultaneously and being vibrated in a right and left direction at a predetermined angle with respect to the rotating direction.

4. A method according to claim 3 wherein the substrate is a through-hole wiring substrate.

5. A method of high-speed plating which comprises carrying out plating of a substrate which is parallelly rotated in a plane including the surface of the substrate simultaneously with being vibrated in an up-and-down direction at a predetermined angle with respect to the rotating direction.

6. A method according to claim 5 wherein the substrate is a through-hole wiring substrate.

* * * * *